US006861799B1

(12) United States Patent
Friend et al.

(10) Patent No.: US 6,861,799 B1
(45) Date of Patent: Mar. 1, 2005

(54) COLOR FILTERS FOR ORGANIC LIGHT-EMISSIVE DEVICES

(75) Inventors: Richard Henry Friend, Cambridge (GB); Karl Pichler, Cupertino, CA (US)

(73) Assignee: Cambridge Display Technology, Ltd., Cambridge (GB)

( * ) Notice: Subject to any disclaimer, the term of this patent is extended or adjusted under 35 U.S.C. 154(b) by 0 days.

(21) Appl. No.: 09/446,476

(22) PCT Filed: Jun. 19, 1998

(86) PCT No.: PCT/GB98/01804

§ 371 (c)(1),
(2), (4) Date: May 8, 2000

(87) PCT Pub. No.: WO98/59529

PCT Pub. Date: Dec. 30, 1998

(30) Foreign Application Priority Data

Jun. 21, 1997 (GB) ............................................. 9713074

(51) Int. Cl.[7] ............................................. H05B 33/22
(52) U.S. Cl. ...................................... 313/504; 313/506
(58) Field of Search ................................. 313/504, 506, 313/112, 507, 501

(56) References Cited

U.S. PATENT DOCUMENTS

| | | | | |
|---|---|---|---|---|
| 3,884,695 A | | 5/1975 | Gallaro et al. ................... 96/30 |
| 4,521,524 A | | 6/1985 | Yamashita ...................... 501/64 |
| 4,769,292 A | * | 9/1988 | Tang et al. ................... 313/504 |
| 5,055,739 A | | 10/1991 | Thioulouse ................... 313/507 |
| 5,093,698 A | * | 3/1992 | Egusa ........................... 257/40 |
| 5,294,870 A | * | 3/1994 | Tang et al. ................... 313/504 |
| 5,315,209 A | | 5/1994 | Iwasaki ........................ 313/478 |
| 5,317,169 A | * | 5/1994 | Nakano et al. ................ 257/40 |
| 5,405,709 A | * | 4/1995 | Littman et al. .............. 428/690 |
| 5,409,783 A | * | 4/1995 | Tang et al. ................... 428/690 |
| 5,540,862 A | | 7/1996 | Cao et al. ..................... 252/500 |
| 5,663,573 A | * | 9/1997 | Epstein et al. ................. 257/40 |
| 5,674,635 A | * | 10/1997 | Hsieh et al. .................. 428/690 |
| 5,776,623 A | * | 7/1998 | Hung et al. ................... 428/690 |
| 5,834,894 A | * | 11/1998 | Shirasaki et al. ............ 313/503 |
| 5,858,561 A | * | 1/1999 | Epstein et al. ............... 428/690 |
| 5,989,737 A | * | 11/1999 | Xie et al. ..................... 313/502 |
| 6,046,543 A | * | 4/2000 | Bulovic et al. .............. 313/504 |
| 6,091,382 A | * | 7/2000 | Shioya et al. ................ 313/504 |
| 6,372,154 B1 | * | 4/2002 | Li ........................... 252/301.16 |
| 6,410,166 B1 | * | 6/2002 | Takahashi et al. ........... 428/690 |
| 6,571,446 B2 | * | 6/2003 | Qiu et al. ................... 29/25.35 |
| 2001/0053462 A1 | * | 12/2001 | Mishima ...................... 428/690 |
| 2002/0014470 A1 | * | 2/2002 | Okada et al. ................. 216/24 |
| 2002/0145380 A1 | * | 10/2002 | Aziz et al. ................... 313/504 |

FOREIGN PATENT DOCUMENTS

| | | |
|---|---|---|
| EP | 0849979 A2 | 6/1998 |
| GB | 2178226 A | 2/1987 |
| JP | 5152076 | 6/1993 |
| JP | 08320656 A | 5/1995 |
| WO | WO96/33445 | 10/1996 |
| WO | WO 98/10473 | 3/1998 |

OTHER PUBLICATIONS

Morgenstein et al., The Photonics Design & Applications Handbook 2, 1988, Laurin Publishing Company, Inc., 34th edition, pp. H–286 to H–292.*
Cacialli et al., "Efficient Green Light–Emitting Diodes From A Phenylated Derivative of Poly(P–Phenylene–Vinylene)," Appl. Phys. Lett. vol. 69, No. 25, Dec. 16, 1996, pp. 3794–3796.

* cited by examiner

Primary Examiner—Vip Patel
Assistant Examiner—Glenn Zimmerman
(74) Attorney, Agent, or Firm—Finnegan, Henderson, Farabow, Garrett & Dunner, LLP

(57) ABSTRACT

An electroluminescent device comprising: an organic light-emissive layer; an electrode on one side of the light-emissive layer for injecting charge carriers of a first polarity towards the light-emissive layer; and a light filtering layer on the other side of the light-emissive layer, the light filtering layer comprising an organic material that is doped to render it at least partially electrically conductive for injection of charge carriers of a second type towards the light-emissive layer.

28 Claims, 4 Drawing Sheets

COLOR FILTERS FOR ORGANIC LIGHT-EMISSIVE DEVICES

FILED OF THE INVENTION

This invention relates to colour filters for organic light-emissive devices, such as light-emissive display devices.

BACKGROUND OF THE INVENTION

Light-emissive electroluminescent devices that employ an organic material for light emission are described in PCT/WO90/13148 and U.S. Pat. No. 4,539,507, the contents of both of which are incorporated herein by reference. The basic structure of these devices is a light-emissive organic layer, for instance a film of a poly(p-phenylenevinylene) ("PPV"), sandwiched between two electrodes. One of the electrodes (the cathode) injects negative charge carriers (electrons) and the other electrode (the anode) injects positive charge carriers (holes). The electrons and holes recombine in the organic layer generating photons. In PCT/WO90/13148 the organic light-emissive material is a polymer. In U.S. Pat. No. 4,539,507 the organic light-emissive material is of the class known as small molecule materials, such as tris-(8-hydroxyquinolino)aluminium ("Alq3"). In a practical device, one of the electrodes is typically transparent, to allow the photons to escape the device.

The performance of such devices can be enhanced by introducing one or more charge transport layers between the light-emissive layer and one or both of the electrodes. Such charge transport layers are typically formed of one or more thin layers of electrically-conducting polymers. Polymers which have been found to be effective in this role include polyaniline, as described in European patent application 91301416.3, and in Y. Yang and A. J. Heeger, Appl. Phys. Lett. 64, 1245–1247 (1994), derivatives of polythiophene, including poly(3-methylthiophene), as described in S. Hayashi, H. Etoh and S. Saito, Jap. Journ. Appl. Phys. 25, 773–775 (1986), and polystyrene-sulphonate-doped polyethylene dioxythiophene (PEDOT:PSS) available from Bayer AG (Germany) and described in UK patent application number 9703172.8.

One approach to producing a full colour display device is to form an array of pixels that can each emit one of the primary colours: red, green and blue, and to control the pixels in the normal way to produce desired colour patterns by combinations of those colours. To optimise the operation of such a device it is important that the red, green and blue colours are emitted with sufficient spectral purity. This poses considerable technical problems. Patterning of the light-emissive films is, although possible, not easily achieved using the traditional techniques of semiconductor photolithography, because the organic materials are themselves susceptible to the photo-patterning or etching steps conventionally used, although this problem is less severe for polymer films than for sublimed films of small molecules. Another approach, which is described in U.S. Pat. No. 5,294,870 and has, for example, also been demonstrated by C. Hosokawa et al. in 'Proceedings of the 49th annual conference of the Society for Imaging Science and Technology, May 1996, Minneapolis, USA, page 388 and by S. Tasch et al. in Advanced Materials 9, 33–36 (1997), is to fabricate an array of blue LEDs, and to use a colour conversion medium to convert this blue emission into either red or green. The colour conversion medium is required to function in a fluorescent mode, but can provide relatively efficient energy conversion between colours. However, this structure suffers from the extra fabrication costs associated with the extra processing steps, and is intrinsically less efficient than structures the do not rely on secondary emission. Another of the problems in the use of such layers is that, as currently exemplified, they are 'passive' layers, which may have to be placed outside the light emitting device (LED) structure, in the path of the emerging radiation. This can, for example, lead to 'colour cross-talk' between pixels due to the thickness of the substrate which is typically positioned between the LED and the colour conversion medium.

F. Cacialli et al., Appl. Phys. Lett 69 (25), 16 Dec. 1996, 3794–3795 describe an organic light-emissive device in which a layer of undoped PPV is found to absorb some light emitted from an underlying emissive layer. However, the electrical properties of the resulting device suffer because there is a significant barrier to onward charge transfer from the PPV layer (e.g. the extra undoped PPV layer increases the drive voltage).

A separate issue is that ambient light incident on a display from its surroundings, for example daylight, can impair the performance of the display. Ambient light can cause unwanted photo-degradation or photo-conduction in components of the display. Some frequencies of ambient light can excite components of the display, especially the light-emissive components, to fluoresce and thus emit unwanted light, reducing contrast.

There is therefore a need for an improved means to permit the fabrication of colour displays, preferably producing purer emission colours and/or multi-colour emission and preferably having good device efficiency and ease of manufacture. There is also a need to reduce problems from ambient light.

SUMMARY OF THE INVENTION

According to the present invention there is provided an electroluminescent device comprising: an organic light-emissive layer; an electrode on one side of the light-emissive layer for injecting charge carriers of a first polarity towards the light-emissive layer; and a light filtering layer on the other side of the light-emissive layer, the light filtering layer comprising an organic material that is doped to render it at least partially electrically conductive for injection of charge carriers of a second type towards the light-emissive layer.

The device may comprise a second electrode on the other side of the light filtering layer from the light-emissive layer, for injecting charge carriers of a second polarity. Alternatively the light filtering layer itself may act as a second electrode for injecting charge carriers of a second polarity.

The light filtering layer may be an absorptive and/or a fluorescent filter. The light filtering layer suitably absorbs light at at least some wavelengths and may or may not re-emit at other wavelengths. The filter layer is preferably absorptive and/or emissive in the optical (visible) range of the spectrum. The light filtering layer suitably absorbs light at some of the wavelengths at which the light-emissive layer is emissive. Alternatively, or in addition, the light filtering layer may absorb ambient light, suitably at at least some wavelengths which would otherwise impair the performance of the light-emissive layer, for example by causing it to degrade or to fluoresce. The light-emissive layer may be excitable to photoluminescence by the said at least some wavelengths; alternatively, or in addition, the light filtering layer may be excitable to luminescence in the visible frequency range by light at at least some of the wavelengths at which the light-emissive layer is emissive.

The device may comprise further layers such as one or more charge transport layers. Such layers may be located between either of the electrodes and the light-emissive layer. A charge transport layer may also be located between the light-emissive layer and the light filtering layer, especially where the light filtering layer acts itself as an electrode, for instance by being connected directly to circuitry for driving the device.

The light filtering layer is preferably adjacent to the light-emissive layer, to improve optical coupling between the two layers.

The device may be a one-, two-, three- or multi-colour emissive device. Further emission colours may be provided by one or more further regions comprising light-emissive material laterally spaced from the light-emissive layer. Those region(s) may comprise further light-emissive material that is emissive with a colour that is different or a similar to the colour with which the said light-emissive layer emits. Such material may be integral with the said light-emissive layer. That region may comprise light-filtering material that absorptively and/or fluorescently filters the light emitted from the further light-emissive material. Such material may be integral with the said light filtering layer. The device may therefore comprise two laterally spaced emissive regions having different emission colours and each comprising respective light-emissive layers and light filtering layers, wherein each region has either:

1) the same materials for light emission and different materials for light filtering;
2) different materials for light emission and the same materials for light filtering; or
3) different materials for light emission and different materials for light filtering; to produce the difference in emission colours between the two regions.

The device may comprise a light filtering layer (either the light filtering layer already mentioned or an additional layer) for filtering ambient light incident on the device. The or each light filtering layer may be a composite layer comprising a stack of individual filtering layers. The said individual filtering layers are preferably compositionally distinct.

The or each light filtering layer is preferably located between the viewing position of the device and the light-emissive layer.

According to a second aspect of the present invention there is provided an electroluminescent device having an organic light-emissive layer for light emission and comprising a light filtering layer located outward of the light-emissive layer in the viewing direction, the light filtering layer having filtering characteristics such that it is capable of absorbing light at at least some wavelengths which would otherwise impair the performance of the light-emissive layer.

Preferably the light filtering layer comprises an organic light-filtering material. That material may be a second organic light-emissive material. The light filtering layer may also comprise other material, which may suitably be blended with the light-filtering material.

The device preferably comprises a pair of electrodes for injecting charge carriers of opposite polarities into the light-emissive layer, which are suitably arranged on either side of the organic light-emissive layer. The light filtering layer may be located between the electrodes, in which case it is preferably electrically conductive. The light filtering layer may be located other than between the electrodes, in which case it may be electrically non-conductive.

Where the filtering layer comprises a second light-emissive material, that material is suitably emissive with a different colour of light from the light-emissive layer.

The light-emissive layer comprises two independent light-emissive regions, with the light filtering layer is patterned to as to filter light from only one of those regions. Those independent light-emissive regions are suitably emissive with different colours of light from each other.

Some preferred materials for the device are as follows:

One of the electrodes (the hole injecting electrode) preferably has a work function of greater than 4.3 eV. That electrode may comprise ITO. The other electrode (the electron injecting electrode) preferably has a work function less than 3.5 eV. That electrode may suitably comprise calcium, lithium, samarium, ytterbium, terbium, barium or an alloy comprising one or more of those metals with or without another metal such as aluminium. At least one of the electrodes is suitably light transmissive, and preferably transparent, suitably at the frequency of light emission from the combination of light-emissive layer and light filtering layer.

Any charge transport layer may suitably comprise one or more polymers such as poly(styrenesulphonic acid) doped poly(ethylenedioxythiophene) and/or poly(2,7-(9,9-di-n-octylfluorene)-(1,4-phenylene-(4-imino (benzoic acid))-1,4-phenylene-(4-imino(benzoic acid))-1,4-phenylene)) ("BFA") and/or polyaniline (doped, undoped or partially doped) and/or PPV.

The light-emissive layer may comprise one or more organic materials, suitably polymers, preferably conjugated or partially conjugated polymers. Suitable materials include PPV, poly(2-methoxy-5-(2'-ethyl) hexyloxyphenylene-vinylene) ("MEH-PPV"), a PPV-derivative (e.g. a di-alkoxy or di-alkyl derivative), a polyfluorene and/or a co-polymer incorporating polyfluorene segments, PPVs and/or related co-polymers, poly (2,7-(9,9-di-n-octylfluorene)-(1,4-phenylene-((4-secbutylphenyl)imino)-1,4-phenylene)) ("TFB"), poly (2,7-(9,9-di-n-octylfluorene)-(1,4-phenylene-((4-methylphenyl)imino)-1,4-phenylene-((4-methylphenyl)imino)-1,4-phenylene)) ("PFM"), poly (2,7-(9,9-di-n-octylfluorene)-(1,4-phenylene-(4-methoxyphenyl)imino)-1,4-phenylene-((4-methoxyphenyl)imino)-1,4-phenylene)) ("PFMO"), poly(2,7-(9,9-di-n-octylfluorene) ("F8") or poly(2,7-(9,9-di-n-octylfluorene)-3,6-Benzothiadiazole) ("F8BT"). Alternative materials include organic molecular light-emitting materials, e.g. Alq3, or any other small sublimed or solution processed molecule or conjugated polymer electroluminescent material as known in the prior art.

Examples of suitable materials for the filtering layer include doped organic light-emissive materials, for instance doped versions of any of the materials set out immediately above as possibilities for the light-emissive layer, or doped versions of any of the materials set out above as possibilities for a charge transport layer. To act as absorptive filters such materials may be treated to reduce their fluorescence. The light filtering layer preferably comprises a doped polymer material. Other materials could be used.

According to a third aspect of the present invention there is provided a method for forming an electroluminescent device, comprising: forming an organic light-emissive layer, forming an electrode on one side of the light-emissive layer for injecting charge carriers of a first polarity towards the light-emissive layer, and forming a light filtering layer on the other side of the light-emissive layer, the light filtering layer comprising an organic material that is doped to render it at least partially electrically conductive for injection of charge carriers of a second type towards the light-emissive layer.

The step of forming a light filtering layer may comprise preparing a light filtering material and doping that material to improve its electrical conductivity. The material may be doped before or after deposition.

BRIEF DESCRIPTION OF THE DRAWINGS

The present invention will now be described by way of example only, with reference to the accompanying drawings in which.

DETAILED DESCRIPTION

Figure 1:
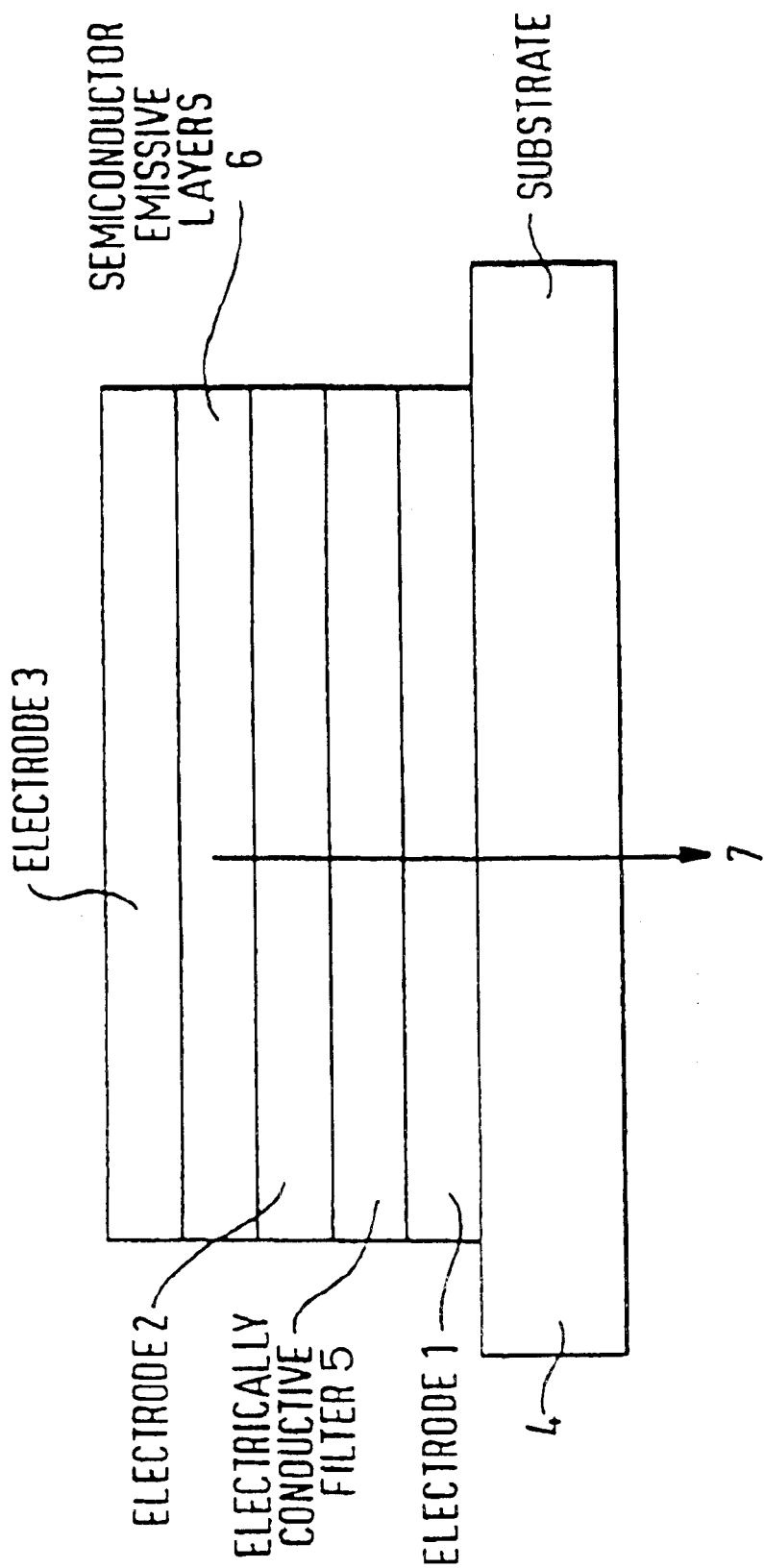
FIG. 1 is a schematic cross-section of a light-emissive device.

FIG. 1 shows a cross-section of an organic light-emissive device for providing red light emission. The same principles can be applied to devices for emitting other colours—blue and green are especially important—and for devices such as full-colour displays having large numbers of pixels of a number of emission colours.

The example embodiment of FIG. 1 is a device in which red emission is provided from a structure which uses a polymer LED which otherwise emits orange-red light. The device comprises a glass substrate 4 on which is deposited a first electrode layer 1 of indium-tin oxide. Sheets of such ITO-coated glass are commercially available.

Over the ITO layer 1 is an electrically conductive optical filter layer 5. This comprises a layer of poly(3-hexyl thiophene) or a similar derivative which is chemically doped with an oxidising agent such as dicyanodichloroquinone (DDQ), so as to achieve an adequately low resistivity (less than $7 \times 10^5$ Ohm cm). This layer is formed by spin-coating from an organic solvent such as chloroform onto layer 1, and has a preferred thickness in the range 50–400 nm.

Over the filter layer 5 is a charge transport or second electrode layer 2, which is provided by a 50 nm thick conductive layer of PEDOT:PSS. This layer is deposited by spin-coating from aqueous-based solution. The solvent is selected to be one that does not re-dissolve the filter layer.

Over the charge transport layer 2 is an organic light-emissive layer 6 of a semiconductive electro-luminescent polymer selected from the group of 2,5-dialkoxy-substituted poly(p-phenylenevinylene) polymers. This is deposited on top of layer 2 by spin-coating from an organic solvent and has a preferred thickness in the range 50–200 nm.

Over the light-emissive layer 6 is a third electrode layer 3, which is formed by thermal evaporation of calcium. An aluminium layer may also be provided over the calcium layer to give a calcium:aluminium electrode structure.

In operation a voltage is applied between the first and third electrodes, such that the calcium electrode 3 is biased negatively with respect to the indium-tin oxide electrode 1. The electrode 3 is thus a cathode and the electrode 1 is an anode. The conductivity of the layers 5 and 2 allows charge to pass from the electrode 1 to the emissive layer 6. When current flows orange-red light emission is generated from the 2,5-dialkoxy-substituted poly(p-phenylenevinylene).

The light emitted from the layer 6 passes through the filter layer, which removes some of the higher energy light, resulting in a red-shifted emission in the light that leaves the device through the light-transmissive electrode 1, as indicated by arrow 7.

In an alternative production method one or more of the filter layer 5, the second electrode 2 and the semi-conducting polymer layer 6 could be deposited by ink-jet printing. In the ink-jet printing process polymers which have been formulated to give necessary control of surface tension and viscosity are most conveniently used. Ink-jet printing is especially useful as a deposition technique because the process of ink-jet printing can be used to provide in-plane patterning of the diode structure during (rather than after) the deposition step. Therefore, other emitters with other combinations of materials that emit light of different colours can be deposited near the red emissive structure of FIG. 1. For example, devices which use unsubstituted poly(p-phenylenevinylene) for the layer 6 provide green emission. Suitable materials for other colours of emission are well-known. It should be noted that a particularly advantageous feature of this fabrication method is that the process of ink-jet printing can be used to deposit in a consecutive manner patterned layers of both the conductive filter and also the emissive semi-conducting polymer layers.

An especially efficient production method is to provide a uniform light-emissive layer but to use one or more filter layers next to the emissive layer so as to provide for two or more emission colours. For instance a three-colour display could be fabricated by depositing, in the filter layer 5, areas of fluorescent and/or absorptive filter materials that are selected to convert the light emitted from a uniform light-emissive layer to red, green or blue. The conversion could be in one or more steps. If the emissive material were to emit satisfactorily in red, green or blue then one of the sets of filters could be omitted. For example, the emissive material could emit blue light. Where blue light was to be produced from the device (in the areas corresponding to blue pixels) a filter medium could be omitted or replaced with a non-filtering light transmissive material. Where red light is to be produced from the device (in the areas corresponding to red pixels) a single fluorescent filter layer could be used to convert the blue light to red or a set of stacked filter layers could be used to convert the blue light to red through at least one intermediate colour such as green. Where green light is to be produced from the device (in the areas corresponding to green pixels) similar arrangements could be used. The light-emissive layer could be formed as a stack of organic molecular layers which can function as blue LEDs when the second electrode is used as the positive electrode in this structure. Such arrangements of layers to form blue LEDs are described by C. Hosokawa et al. in J. Appl. Phys. 78, 5831–5833 (1995). In these devices, a third electrode layer is formed with an alloy of magnesium/silver, and is biased negatively with respect to the first electrode.

The filter layer could be patterned after having been deposited or could be deposited in a patterned state, for example by ink-jet printing. Ink-jet printing is a preferred process because of its capacity for fine control over the deposited pattern.

The glass substrate 4 could be formed of other materials such as transparent plastics materials.

Other preferred materials for the first electrode include semi-transparent and highly conductive films of inorganic oxides such as indium/tin oxide, fluorine-doped tin-oxide, aluminium-doped zinc-oxide, etc. It is preferred that the sheet resistance of the electrode is low (most preferably less than 100 Ohms/square but even better less than 30 Ohms/square) in order that electric current can be readily passed from an external contact at an edge of the device and flow within the plane of the film so as to supply current evenly to all parts of device.

Other preferred materials for the charge transport layer/second electrode include thin films of electrically conducting polymers, for instance based on polyaniline, polythiophene or polypyrrole or derivatives of these polymers, which have been suitably doped so as to achieve an adequate level of conductivity, but which also retain adequate optical transparency. Preferred thicknesses are of the order of 100 nm or less, and resistivities to achieve good device performance are in the range of 0.1 to 10000 Ohm cm, but preferably not more than 1000 Ohm cm. A conductive material which is suitable for this role is polystyrene-sulphonate-doped polyethylene dioxythiophene, PEDOT:PSS, as for example described in UK patent application number 9703172.8.

Other preferred materials for the filter layer can be selected in several ways. The filter layer could be formed of one material that acts as an optical filter and is also conductive or a combination of materials, for example a combination of a conductive component with a filtering component. Two such components are preferably blended intimately but could be phase-separated in a random or ordered way. As the conductive component one or more of the materials proposed above for use in the second electrode could be chosen. The conductive material itself could perform the light filtering function, in which case the separate filtering component could be omitted; thus, polythiophene and its derivatives with similar optical properties, such as the poly(3-alkylthiophene)s provide good filters for the transmission of red light when undoped, and retain their optical characteristic when lightly doped to form a conductive material. A number of dopants may be suitable in this role, including dicyanodichloroquinone (DDQ), as described for example by C. P. Jarrett et al. in J. Appl. Phys. 77, 6289–6294 (1995). Other conjugated polymers may also provide useful filters, for example cyano derivatives of poly(phenylenevinylene) can provide efficient red filter materials, functioning both in absorption and also in re-emission (i.e. fluorescence) mode. Such materials are described in U.S. Pat. No. 5,514,878. Materials which function as filters may also be selected from the range of pigments and dyes, such as those which are used to provide filters in liquid-crystal graphic displays, and materials used as fluorescent filters in emissive displays in which red and green are produced by wavelength conversion from blue. Preferred thicknesses for such composite or non-composite layers are in the range 50–500 nm. Optical properties are readily engineered by selecting the total thickness of such a composite material such that the concentration of optical material per unit area is the same as would be used if that material were used alone—in other words the total thickness of the composite material is increased to allow for the volume fraction occupied by the other components present in the composite.

There are well-established rules governing the properties of such composite materials such that they can be formulated to provide appropriate optical and conductive properties. The conductive properties are controlled by the requirement that there be a conductive pathway through the composite material via those regions which are conductive. This well-known requirement for there to be a 'percolation path' is extensively documented in the context of composite conductive materials such as graphite- or charge-transfer-compound-loaded polymers. The requirements for the present application are not particularly demanding, since the current densities which are typically passed through thin-film LEDs of this type do not normally exceed 30 mA/cm$^2$ on average. The design criterion that sets a limit to acceptable performance for these layers is the ohmic voltage drop across the electrically conductive optical filter layer. A desirable upper limit to this voltage is 1 V. It is thus noted that for a layer of thickness 500 nm, passing a current density of 30 mA/cm$^2$, the resistivity for this layer should typically not exceed 7×10$^5$ Ohm cm. It may thus be desirable to operate the LED in a pulsed mode, with a short duty-cycle, in which a high current flows for a short time, followed by a longer period with little or no current flow. This, for example, is required when driving such an LED as part of a passive matrix display, which for practical displays may require a peak current density up to 1000 times higher than average. At this increased current density, the resistivity of the composite layer must not exceed, say, 700 Ohm cm. This level of conductivity is easily attained in the doped conjugated polymers mentioned above, even when considerably diluted by the presence of a non-conductive phase (which would here be a optical filter material). Consideration must be given to the interference in operation of the electrical and optical functions of these structures. Where separate materials are used to provide the two functions of filtering and conduction, little interference is expected. However, where the same material is used both to provide the electrically conductive layer and also the optical filter, the design of the structure must take account of the changes in optical properties, including absorption and fluorescence, that are brought about by the chemical doping necessary to raise the conductivity. An example is provided by polythiophene, which when undoped can act as a 'red' filter, passing red light, but absorbing green and blue. When heavily doped, however, its optical absorption in the green and blue is reduced. The criteria proposed here for the maximum acceptable resistivity require only light to moderate doping, such that it can still be used as a 'red' filter.

Such electrically conductive optical filter layers used as described above give a number of desirable properties to the processes for manufacture of LED structures and to their optical performance. Processing advantages have been mentioned above. Performance advantages include: firstly the ability to achieve red and green emission by conversion from blue or white; secondly, the ability to 'clean up' emission to provide a single purer colour. For example, a 'red' filter may be used to provide red emission from an LED that emits both red and orange light. Similarly, green emission may be obtained by filtering to remove components of red and blue that might be emitted by an LED, and blue emission by removal of red and green components.

The relative performances of four devices A to D will be discussed in detail to demonstrate the effectiveness of the principles described above. The structures of the devices are as follows:

A: glass/ITO/PEDOT:PSS/MEH-PPV/Ca:Al

B: glass/ITO/P3DT/PEDOT:PSS/MEH-PPV/Ca:Al

C: glass/ITO/DDQ-doped P3DT/PEDOT:PSS/MEH-PPV/Ca:Al

D: as C but with the DDQ-doped P3DT layer doped in a different ratio

Figure 2:
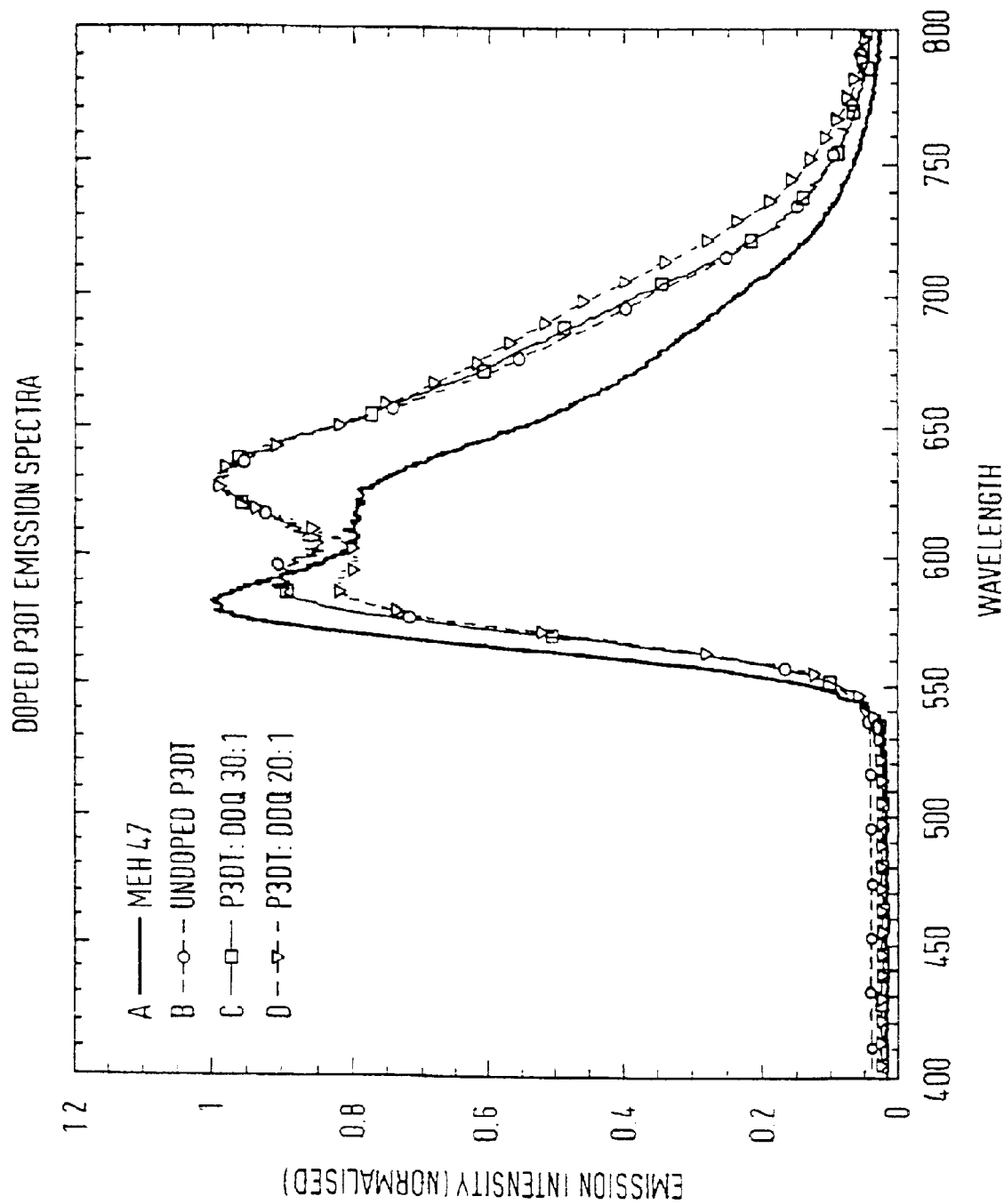
FIG. 2 shows the emission spectra of four example devices.
Figure 3:
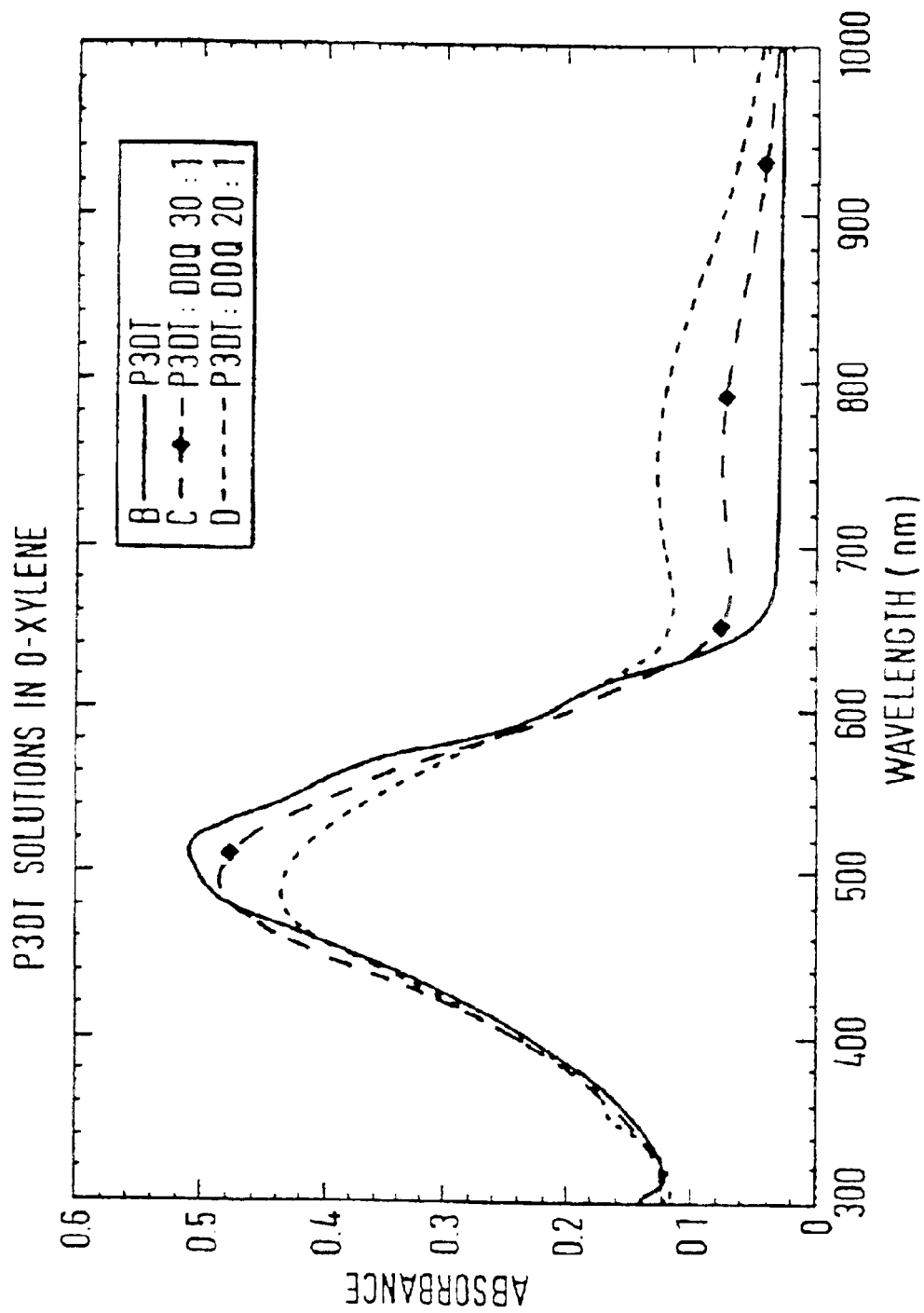
FIG. 3 shows the absorption spectra of three example filter layers.

FIG. 2 shows plots of the emission spectra from the four devices. Device A emits orange light (pure MEH-PPV emission). In devices B to C the P3DT (poly(3-dodecyl thiophene)) layer acts as an optical filter layer and the emission from those devices is redder due to absorption by the P3DT of some of the high-energy tail of the MEH-PPV emission. FIG. 3 shows the absorption spectra of the pure and doped P3DT films of devices B to D. The composition of the filter layer could be selected to optimise its absorption spectrum and hence the emission spectrum of the overall device.

Figure 4:
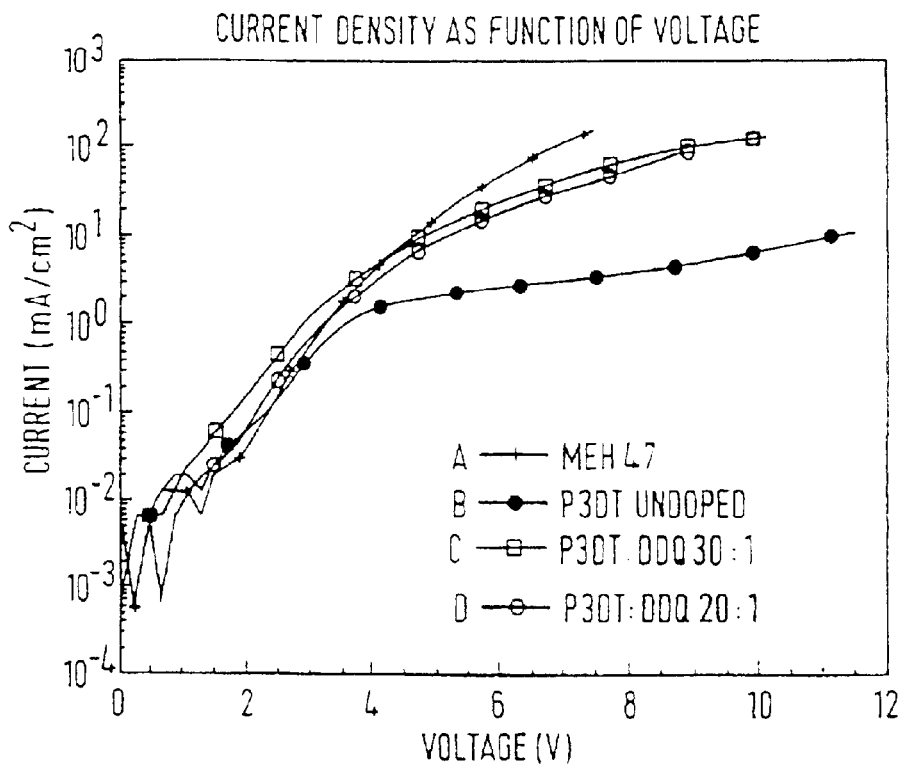
FIG. 4 plots current density against voltage for the four example devices.
Figure 5:
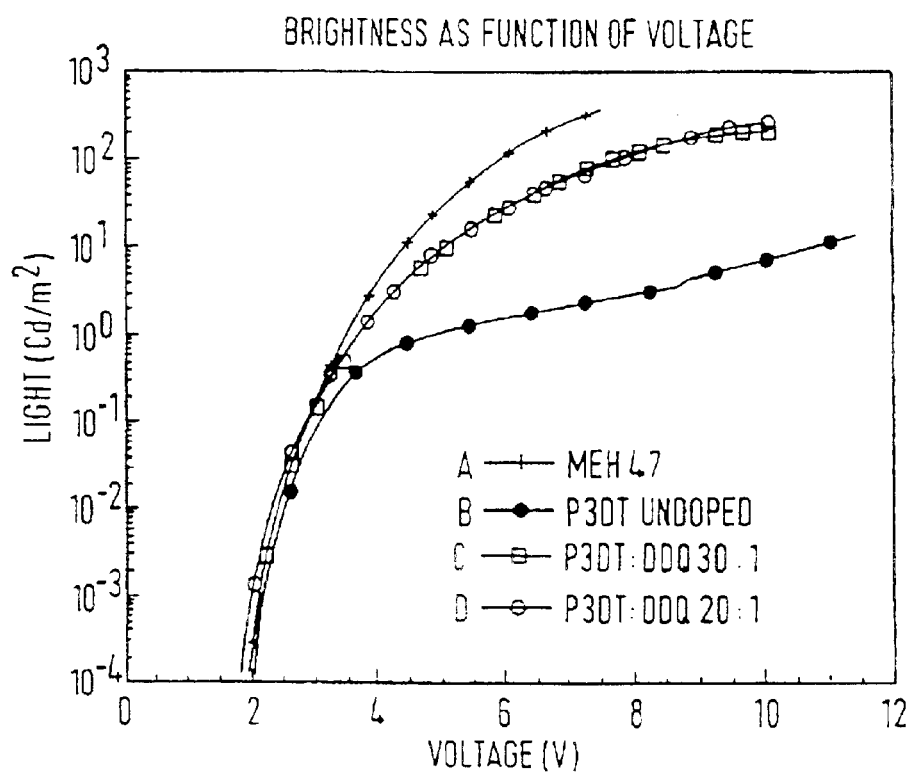
FIG. 5 plots brightness against voltage for the four example devices.

FIGS. 4 and 5 illustrate the electrical performance of the devices. The performance of device B is significantly poorer than that of device A. However, doping the P3DT layer to increase its conductivity gives a device performance close to that of device A, which has no filter layer.

The PEDOT:PSS layers were deposited using PEDOT:PSS from Bayer AG spun from water-based solution, filtered through a 1 μm filter and then dried (110° C., 60 min in high purity nitrogen) to give a film thickness of roughly 40 nm. The MEH-PPV layers were spun from tetrachloroethane solution to give a thickness of roughly 90 nm. The cathodes were formed by depositing 60 nm of Ca followed by 200 nm of Al, both by thermal evaporation. The P3DT layers for devices B to D were formed using P3DT purchased from Aldrich. The pure solution, for device B, was 2% w/v in dry o-xylene. For the DDQ-doped solutions for devices C and D 0.08 mmole DDQ was made up in 1 ml dry o-xylene. Then for the P3DT:DDQ=30:1 of device C 3 ml of the 2% P3DT solution as for device B was mixed with 0.1 ml of the DDQ solution. For the P3DT:DDQ=20:1 of device C 2 ml of the 2% P3DT solution as for device B was mixed with 0.1 ml of the DDQ solution. For devices B, C and D the respective P3DT solutions were spun to give a film thickness of approximately 105 nm.

The procedure for forming devices A to D was as follows. Commercially available ITO-coated glass was given a standard clean using solvent followed by a 3 minute oxygen plasma clean. Then the layers were deposited successively as described above in the order indicated above for each device. Devices B to D were given a very brief (5 seconds) low power oxygen plasma treatment between spinning of the P3DT and the PEDOT:PSS layers to improve wetting of the PEDOT:PSS on to the P3DT. After deposition of the final (cathode) layer the devices had contacts fitted and were encapsulated with epoxy/glass in a glove box.

Devices C and D correspond to the device shown in FIG. 1, with the layers of the devices corresponding to the reference numerals of FIG. 1 as follows: glass-4, ITO-1, DDQ-doped P3DT-5, PEDOT:PSS-2, MEH-PPV-6, Ca:Al-3.

Another use for filtering layers such as the layer 5 in FIG. 1 is to restrict the passage of ambient light into the display device. This is important for a number of reasons, for example, to increase contrast by reducing photoluminescence (fluorescence) due to one or more layers of the device (especially the luminescent layer 6) being excited by ambient light, to reduce photo-degradation of the device due to ambient light or to reduce photo-conduction effects.

The wavelengths at which a luminescent material emits light are typically longer than the wavelengths that excite the material to photoluminescence. Therefore, to reduce photoluminescence due to excitation by ambient light an absorptive filter can be located between emissive material of the device and a viewer, the wavelength at which the material absorbs being shorter than those at which it transmits. Desired properties for the material for such a filter are thus that it functions as a long wavelength pass filter and that it shows little or no photoluminescence (fluorescence) itself. Suitable filtering materials for this application include organic and inorganic pigments and in addition many of the organic materials that can be used as light-emissive materials, provided that the latter are chosen or modified so that their fluorescence is low. The materials of the latter class are particularly attractive because they would be expected to match well optically and/or mechanically to adjacent material of a similar type, for example a light-emissive layer. There are many ways in which fluorescence efficiencies can be reduced to a very low level. For example, conjugated polymers such as PPV can have their fluorescence efficiencies reduced to low levels through the addition of one or more other components which can be in low quantities. These other components could include aldehyde-terminated PPV oligomers (see "Photophysics of Phenylenevinylene Polymers", L. J. Rothberg et al., Synth. Met. 80, 41–58 (1996)) which can be introduced as products of photo-oxidation (see "Singlet Intrachain Exciton Generation and Decay in Poly(p-phenylenevinylene)", N. T. Harrison et al., Phys. Rev. Lett. 77, 1881–1884 (1996)) or other electron accepting components such as fullerene ("Photoinduced Electron Transfer from a Conducting Polymer to Buckminsterfullerene", N. S. Sariciftci et al., Science 258, 1474–1476 (1992)) and cyano-derivatives of PPV (see "Efficient Photodiodes from Interpenetrating Polymer Networks", J. J. M. Halls et al., Nature 376, 498–500 (1995)). Alternatively, other efficient photoluminescence quenchers could be added, such as impurities (e.g. ions or metals, especially transition metals). Thicknesses of such filter layers are suitably selected so that there is very substantial absorption of ambient light within the absorption bands of the filter; for example, where PPV (treated to be non-fluorescent by, for instance, photo-oxidation) is used a thickness preferably in excess of 200 nm and generally in the range 100 to 1000 nm is appropriate.

In a multicolour display it may be desirable to use a different ambient light filter in conjunction with each emission colour, so that the wavelengths of ambient light that cause fluorescence in each type of emissive material in the device are attenuated but emission from the device is not significantly affected.

The ambient light filter may be electrically conductive, as described above, in which case it could be located between the electrodes of the device. Alternatively it could be located outside the electrodes of the device, suitably between a transparent electrode and the viewer, or could itself be one of the electrodes of the device.

Multi-colour emissive devices have been proposed in which one colour is emitted by a material which is also used as a matrix material for composite emissive regions responsible for the emission of the other colour(s). The composite regions are formed by blending the matrix material with a few percent of other material(s) that generate emission of the other colour(s). One example is a red, green, blue device in which the blue emission is provided by a material that emits blue light and the red and green emission is provided by regions where that blue-emissive material is blended with a few percent of red- and green-emissive materials respectively. In a three colour device in which emission is provided by blended materials and the matrix polymer for green and red emission has the same or similar absorption (e.g. onset of absorption at the same wavelength) as the blue emissive material then a uniform non-fluorescent colour (cut-off) filter layer could be used all over the display, without the need for patterning over red, green and blue emissive regions or pixels. The onset of absorption in the filter layer should be in between the onset of absorption and emission of the blue emissive material. This would eliminate photoluminescence in the blue pixel due to excitation by ambient light and if the red and green pixels contained mostly blue (or blue-type) material the red and green emissive pixels (with only a small proportion of red or green emitter in blue matrix) would absorb little ambient light and hence suffer little from photoluminescence due to ambient light. The result is an increase in contrast. It will be apparent that the filter layer could be anywhere between the viewer and the outermost electrode (the anode in a device of the configuration of FIG. 1), e.g. between the viewer and a transparent substrate layer analogous to the glass layer of FIG. 1 or between that layer and the outermost electrode. If the filter layer were electrically conductive it could even be located behind that electrode layer. Some examples of materials for the filter layer include standard glass or plastic cut-off filters (e.g. Schott glasses) or versions of the blue emissive polymer with low photoluminescence efficiency (e.g. photo-oxidised material, impure material or material with added photostabilisers such as coloured benzophenones) or generally one of the many low photoluminescence colour filter materials. The filter may be a filter of any suitable pass band, including band-pass and cut-off filters.

An advantage can often be gained from, where feasible, locating the filter close or even adjacent to the emissive layer: this allows for good optical coupling of the emissive layer to the filter. It is, for instance preferred that there is not a layer of glass or another inactive layer of the device between a filter layer and an emissive layer. This is especially important when the thickness of such an inactive layer may be greater than the pixel size of the device.

Ambient light filters as described above may conveniently be deposited by numerous techniques, including ink-jet printing.

The relative positions of the anode and cathode electrodes in the devices described above could be reversed, so that the cathode electrode is closest to the viewer. If necessary, other changes could be made to the device structures to accommodate this.

The present invention may include any feature or combination of features disclosed herein either implicitly or explicitly or any generalisation thereof, irrespective of whether it relates to the presently claimed invention. In view of the foregoing description it will be evident to a person skilled in the art that various modifications may be made within the scope of the invention.

What is claimed is:

1. An electroluminescent device comprising:
   an organic light-emissive layer;
   a first electrode on one side of the light-emissive layer for injecting charge carriers of a first polarity towards the light-emissive layer;
   a light filtering layer on the other side of the light-emissive layer, the light filtering layer comprising an organic material that is doped to render it at least partially electrically conductive for injection of charge carriers of a second polarity towards the light-emissive layer, and wherein the light filtering layer is tailored to:
      absorb an emission color of the light-emissive layer and emit light of a different color; or
      transmit an emission color of the light-emissive layer and absorb light of other colors; and
   a second electrode on the other side of the light filtering layer from the light-emissive layer, for injecting charge carriers of a second polarity.

2. An electroluminescent device as claimed in claim 1, wherein the light filtering layer is a fluorescent filter.

3. An electroluminescent device as claimed in claim 2, wherein the light filtering layer is excitable to luminescence in the optical frequency range by light at at least some of the wavelengths at which the light-emissive layer is emissive.

4. An electroluminescent device as claimed in claim 1, further comprising a charge transport layer located between the light-emissive layer and the light filtering layer.

5. An electroluminescent device as claimed in claim 1, wherein the light filtering layer is adjacent to the light-emissive layer.

6. An electroluminescent device as claimed in claim 1, further comprising:
   a charge transport layer between the first electrode and the light-emissive layer; and
   at least one further region of light-emissive material laterally spaced from the light-emissive layer.

7. An electroluminescent device as claimed in claim 6, wherein the said further region is emissive with a different color from the light-emissive layer.

8. An electroluminescent device as claimed in claim 1, wherein the light-emissive layer comprises a conjugated polymer light-emissive material.

9. An electroluminescent device as claimed in claim 1, wherein the light filtering layer comprises a polymer material with the dopant.

10. An electroluminescent device as claimed in claim 1, wherein the light filtering layer is located outward of the light-emissive layer in the viewing direction, the light filtering layer having filtering characteristics such that it is capable of absorbing ambient light of at least some wavelengths which would otherwise impair the performance of the light-emissive layer.

11. An electroluminescent device as claimed in claim 10, wherein the light filtering layer is electrically conductive.

12. An electroluminescent device as claimed in claim 10, wherein the light filtering layer has low luminescence.

13. An electroluminescent device as claimed in claim 10, wherein the light filtering layer comprises at least two materials, at least one of which is a second organic light-emissive material and/or a light-absorptive material.

14. An electroluminescent device as claimed in claim 13, wherein the second light-emissive material is emissive with a different color of light from the light-emissive layer.

15. An electroluminescent device as claimed in claim 10, wherein the light-emissive layer comprises at least two independent light-emissive regions.

16. An electroluminescent device as claimed in claim 15, wherein the independent light-emissive regions are emissive with different colors of light from each other.

17. An electroluminescent device as claimed in claim 16, wherein the composition of the light filtering layer over each light-emissive region is tailored to the emission color of the respective light-emissive region.

18. An electroluminescent device as claimed in claim 10, wherein the light filtering layer comprises an organic material that is employed for light emission in the light-emissive layer.

19. An electroluminescent device as claimed in claim 10, wherein the light filtering layer is an ink-jet printed light-filtering layer.

20. An electroluminescent device as claimed in claim 1, further comprising a charge transport layer located between the light-emissive layer and the second electrode.

21. An electroluminescent device as claimed in claim 1, wherein the light filtering layer selectively shifts the emission that leaves the device.

22. An electroluminescent device as claimed in claim 1, wherein the light filtering layer selectively converts the light emitted from the light-emissive layer.

23. An electroluminescent device as claimed in claim 1, wherein the light filtering layer functions as a color band-pass or cut-off filter.

24. An electroluminescent device as claimed in claim 10, wherein the ambient light filtering layer restricts the passage of ambient light into the device.

25. An electroluminescent device as claimed in claim 10, wherein the ambient light filtering layer increases contrast by reducing photoluminescence due to one or more layers of the device being excited by ambient light.

26. An electroluminescent device as claimed in claim 10, wherein the ambient light filtering layer reduces photo-degradation of the device due to ambient light.

27. An electroluminescent device as claimed in claim 10, wherein the ambient light filtering layer reduces photo-conduction effects of the device due to ambient light.

28. An electroluminescent device comprising:

an organic light-emissive layer;

a first electrode on one side of the light-emissive layer for injecting charge carriers of a first polarity towards the light-emissive layer;

a light filtering layer on the other side of the light-emissive layer, the light filtering layer comprising an organic material that is doped to render it at least partially electrically conductive for injection of charge carriers of a second polarity towards the light-emissive layer;

a second electrode on the other side of the light filtering layer from the light-emissive layer, for injecting charge carriers of a second polarity, wherein the light filtering layer is located outward of the light-emissive layer in the viewing direction, the light filtering layer having filtering characteristics such that it is capable of absorbing ambient light of at least some wavelengths which would otherwise impair the performance of the light-emissive layer;

wherein the light filtering layer has low luminescence, and wherein emission from the device is not significantly affected by the light filtering layer.

* * * * *